(12) United States Patent
Mori

(10) Patent No.: US 6,215,245 B1
(45) Date of Patent: Apr. 10, 2001

(54) ORGANIC ELECTROLUMINESCENT LIGHT EMITTING DEVICES

(75) Inventor: Masami Mori, Yamanashi (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/110,131

(22) Filed: Jul. 6, 1998

(30) Foreign Application Priority Data

Jul. 4, 1997 (JP) .................................................... 9-194810

(51) Int. Cl.⁷ .................................................... H05B 33/00
(52) U.S. Cl. ........................ 313/506; 313/503; 428/917
(58) Field of Search ................................ 313/506, 503; 428/690, 917

(56) References Cited

U.S. PATENT DOCUMENTS 3,173,050  3/1965  Gurnee .
4,885,211  12/1989  Tang et al. .
5,923,119 *  7/1999  Hara et al. ........................ 313/503 X

FOREIGN PATENT DOCUMENTS 60-165771  8/1985  (JP) .
2-15595  1/1990  (JP) .

* cited by examiner

*Primary Examiner*—Ashok Patel
(74) *Attorney, Agent, or Firm*—Oblon, Spivak, McClelland, Maier & Neustadt, P.C.

(57) ABSTRACT

An organic EL device comprises a film form of cathode prepared by a sputtering technique, and formed of an alloy of sodium and/or potassium. This cathode is improved in terms of its adhesion to the interface between the cathode and an organic layer and electron injection efficiency, resulting in light emission property improvements. In addition, this cathode causes less damage to the organic layer, is effective for prevention of occurrence of dark spots, and suffers from little or no degradation of performance.

8 Claims, 1 Drawing Sheet

ORGANIC ELECTROLUMINESCENT LIGHT EMITTING DEVICES

TECHNICAL FIELD

The present invention relates generally to an organic electroluminescent light emitting device (which will hereinafter be often called an organic EL device for short) using an organic compound, and more particularly to an cathode for feeding electrons to a light emitting layer.

BACKGROUND TECHNIQUE

In recent years, organic EL devices have been under intensive investigation. One such organic EL device basically includes a transparent electrode (anode) of tin-doped indium oxide (ITO), etc. A thin film is formed on the transparent electrode by evaporating a hole transporting material such as tetraphenyldiamine (TPD). A light emitting layer of a fluorescent material such as an aluminum quinolinol complex ($Alq^3$) is deposited on the hole transporting thin film. An electrode (cathode) is formed thereon from a metal having a low work function such as magnesium or Mg. This organic EL device attracts attentions because it can achieve a very high luminance ranging from several hundreds to tens of thousands $cd/m^2$ with a voltage of approximately 10 volts.

A cathode considered to be effective for such organic EL devices is made up of a material capable of injecting more electrons into the light emitting layer. In other words, the lower the work function of a material, the more suitable is the material as the cathode. Various materials having a low work function are available. For instance, the materials which are used as the cathodes of organic EL devices generally include MgAg, and AlLi disclosed in JP-A 4-233194. The reason is that the production process for organic EL devices relies mainly upon evaporation making use of resistance heating, and so the evaporation source used therewith is as a matter of course limited to one having a high vapor pressure at low temperatures. A cathode produced by such an evaporation process making use of resistance heating is poor in its adhesion to the interface between the cathode and the organic layer. Consequently, non-light emitting spots called dark spots occur on pixels just after production. The dark spots become large as the device is driven, and so become a leading factor that governs the service life of the device.

The aforesaid JP-A 4-233194 describes that alkali earth metals, and rare earth metals having a low work function are suitable for cathodes, and adds that alkali metals are excluded from electrode materials because they are too unstable for use as electrodes.

On the other hand, JP-A 4-212287 discloses that relatively stable alloys comprising alkali metal elements and other metals and having a low work function are usable as cathodes. More specifically, the cathode alloys disclosed therein are composed mainly of alkali metal elements such as Li, Na, and K, and more stable other metals such as Mg, Al, In, Sn, Zn, Ag, and Zr. Here, the alkali metal elements such as Li, Na, and K are stabilized by alloying with more stable metals such as Mg, Al, In, Sn, Zn, Ag, and Zr. However, the examples given therein reveal that alloying is carried out by co-evaporation. It is thus believed that the aforesaid stabilizing metals, too, are limited from the standpoint of vapor pressure. Furthermore, the organic EL element set forth therein fails to solve the aforesaid problem because the constituting films are all formed by evaporation.

SUMMARY OF THE INVENTION

It is therefore an object of the invention to achieve an organic EL device comprising a cathode which is improved in terms of its interfacial adhesion to an organic layer and electron injection efficiency, and so makes a contribution to improvements in light emission properties and causes less damage to the organic layer, and which reduces the occurrence of dark spots and suffers from little or no degradation of performance.

Such an object is achieved by the inventions defined below as (1) to (9).

(1) An organic EL device comprising a film form of cathode prepared by a sputtering technique, and formed of an alloy of sodium and/or potassium.

(2) The organic EL device according to (1), wherein said cathode has a concentration gradient in a thickness-wise direction thereof, said concentration gradient having a higher concentration of sodium and/or potassium on an interface side between said cathode and an organic layer.

(3) The organic EL device according to (1) or (2), wherein said cathode further comprises an aluminum alloy layer composed mainly of aluminum on a side thereof that is not opposite to said interface between said cathode and an organic layer.

(4) The organic EL device according to any one of (1) to (3), wherein said alloy is an alloy of sodium and/or potassium with at least one element selected from a group consisting of a transition metal element, aluminum, gallium, indium, and titanium.

(5) The organic EL device according to any one of (1) to (4), wherein said transition metal element is chromium, iron, cobalt, nickel, copper, zinc, rubidium, niobium, molybdenum, ruthenium, rhodium, palladium, silver, lanthanum, tantalum, tungsten, rhenium, osmium, iridium, platinum, gold, polonium, and thorium.

(6) The organic EL device according to any one of (3) to (5), wherein said aluminum alloy layer having an aluminum content of at least 80 at %.

(7) A method of fabricating an organic EL device, wherein a film form of cathode as recited in any one of (1) to (6) is prepared by a sputtering technique under a film forming condition where a product of a film forming gas pressure and a substrate-to-target distance is 20 to 65 Pa.cm.

(8) The method according to (7), wherein at least one gas selected from a group consisting of argon, krypton, and xenon is used as a film forming gas.

(9) The method according to (7) or (8), wherein said sputtering technique is a DC sputtering process.

BRIEF DESCRIPTION OF THE DRAWINGS

The above and other objects, features, and advantages of the invention will be better understood from the following description taken in conjunction with the accompanying drawing.

DETAILED DESCRIPTION OF THE INVENTION

Figure 1:
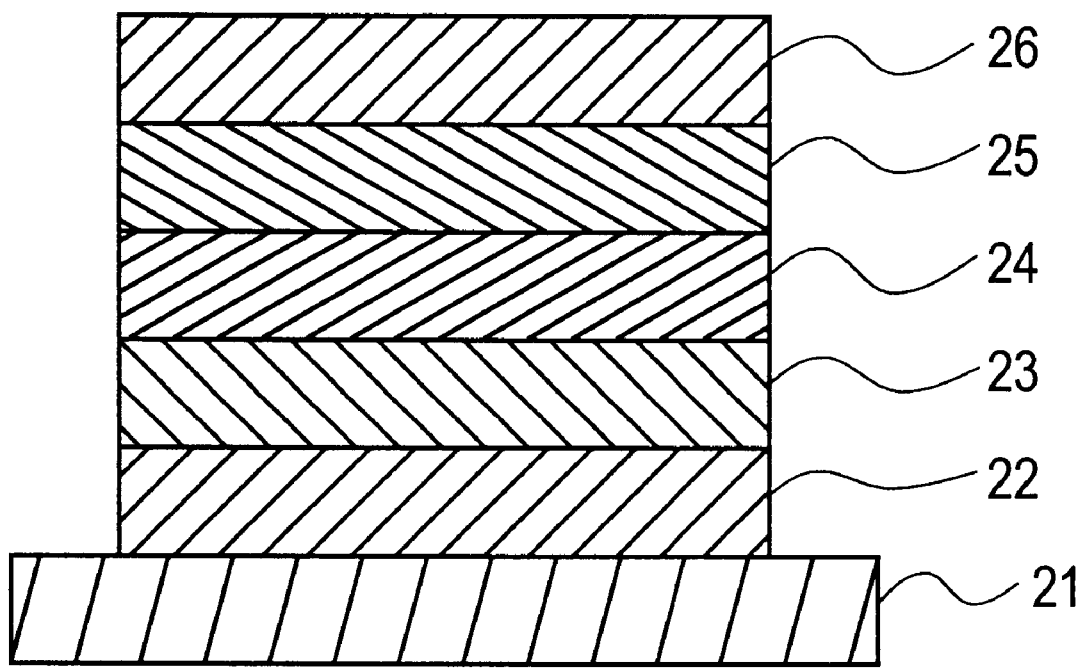
FIG. 1 is a general schematic illustration of one exemplary embodiment of the organic EL device according to the invention.

Some preferred embodiments of the invention will now be explained at great length.

The organic EL device of the invention comprises a film form of cathode prepared by a sputtering technique and formed of an alloy of sodium and/or potassium with other stable metal or metals.

In the cathode film formed by the sputtering technique, the atoms or atom groups upon sputtering have a kinetic energy relatively higher than those on an evaporation technique, so that the adhesion of the cathode film to the organic layer at their interface is improved due to a surface migration effect. In addition, an oxide layer can be removed in vacuum from the surface of the sputtering target by pre-sputtering, or moisture and oxygen can be also removed from the organic layer interface, on which they are adsorbed, by reverse sputtering to form a clean electrode-organic layer interface or a clean electrode, so that organic EL devices of high quality can be produced. It is also acceptable to use a mixture of materials having largely varying vapor pressures as the target, because there is only slight a deviation of the composition of the resultant film from the target composition. The sputtering technique is additionally advantageous over the evaporation technique in terms of uniform film thickness and quality as well as productivity, because it is unnecessary to feed the raw material over an extended period of time.

The optimum content of sodium and/or potassium forming the cathode may be determined depending on the stable metal to be combined therewith. However, the content of sodium and/or potassium is in the range of preferably 0.1 to 99 at %, and more preferably 1 to 60 at %, especially 1 to 30 at % although the invention is not limited thereto. Too much sodium and/or potassium elements are not desired because the stability of the cathode becomes worse, while too little is again not desired because the advantages of the invention are unachievable. If the cathode can be made up of sodium and/or potassium elements alone, it is then possible to make the work function lowest. However, since the sodium and/or potassium elements are extremely reactive and, hence, unstable materials, it is preferable to mix them with relatively stable other metal for stabilization. For the metal to be mixed with the sodium and/or potassium elements, use may be made of at least one selected from the group consisting of a transition metal elements, aluminum or Al, gallium or Ga, indium or In, and titanium or Ti, all being well conductive and relatively stable in the air, or an alloy of these metals. Among the transition metal elements, it is particularly preferable to use chromium or Cr, iron or Fe, cobalt or Co, nickel or Ni, copper or Cu, zinc or Zn, rubidium or Rb, niobium or Nb, molybdenum or Mo, ruthenium or Ru, rhodium or Rh, palladium or Pd, silver or Ag, lanthanum or La, tantalum or Ta, tungsten or W, rhenium or Re, osmium or Os, iridium or Ir, platinum or Pt, gold or Au, polonium or Po, and thorium or Th, all being relatively well conductive. When these alloys are used, the alloying elements may be mixed together at any desired ratio. Stable compounds, too, may be used if their conductivity is equivalent to those of pure metals. The stable compounds, for instance, include $IrO_2$, $MoO_2$, NbO, $OsO_2$, $ReO_2$, $ReO_3$, and $RuO_2$.

It is to be noted that in addition to these stable metals, the cathode may contain about 1 to 80 at % of tin or Sn, silicon or Si, lead or Pb, germanium or Ge, etc.

The cathode formed may have a concentration gradient profile wherein the concentration of Na and/or K elements varies in such a thickness-wise direction that a good many of Na and/or K elements are present on the interface between the electrode and the organic layer contiguous thereto while a good many of stable metal elements are present on the opposite surface. By imparting such a concentration gradient across the cathode, the Na and/or K elements having a low work function can be present at a high concentration to the electrode-organic layer interface that is required to have a function of injecting electrons, while the Na and/or K elements of high reactivity can be present at a low concentration to the opposite surface that is likely to come in contact with the air, etc. It is thus possible to achieve an cathode having increased stability while high electron injection efficiency is maintained. To impart a concentration gradient of the Na and/or K elements across the cathode is easily achieved by the simultaneous use of a mixed sputtering target of a stable metal and Na and/or K elements, and a stable metal target while the respective film formation rates are placed under appropriate control. Here, let Co represent the concentration of Na and/or K across at least a sectional portion of the cathode extending from the interface of the cathode and the side of the organic layer not opposite thereto to the position corresponding to one-third of the cathode thickness and Ci denote the concentration of Na and/or K across at least a sectional portion of the cathode extending from the organic layer-cathode interface to the position corresponding to one-third of the cathode thickness. In the invention, it is preferred that the cathode has a concentration gradient in the Co/Ci range of 0.5 or lower, and especially $10^{-3}$ to 0.4. Such a concentration gradient, for instance, may be confirmed by using suitable means such as Auger spectroscopy while carrying out ion etching.

Instead of such a continuous concentration gradient, a non-continuous (stepwise) concentration gradient may also be imparted across the cathode in such a way that a film having a varying proportion of the Na and K elements is formed. Alternatively, a stable metal layer may be laminated on the mixed layer. For the metal layer to be laminated, it is preferable to use an aluminum compound that is of good conductivity and is allowed to exist relatively stably even in the air. Preferably in this case, the mixed layer has a thickness of the order of 5 to 80 nm while the stable metal layer has a thickness of the order of 100 to 300 nm.

The aluminum compound to be laminated on the aforesaid mixed layer has an additional effect on keeping the electrical resistance of the cathode low, and is preferably composed mainly of aluminum having considerably low electrical resistance with an Al content of at least 80 at %, and especially 85 to 99 at %. The metal layer to be laminated is not limited to the aluminum compound, and so the aluminum compound may be replaced by a stable metal that is of low resistance and stable in the air, etc.

When the cathode in a film form is formed by sputtering, it is preferable to use for the sputtering gas argon or Ar, krypton or Kr or xenon or Xe or a mixture containing at least one of these gases. More preferably, the cathode is formed by DC sputtering under a film forming condition where the product of the film forming gas pressure and the substrate-to-target distance should be in the range of 20 to 65 Pa.cm.

For the sputtering gas, inert gases used with ordinary sputtering systems can be used. For reactive sputtering, reactive gases such as $N_2$, $H_2$, $O_2$, $C_2H_4$ and $NH_3$ may be used in addition to these gases. However, preference is given to any one of Ar, Kr and Xe or a mixed gas containing at least one of these gases. These gases are preferable due to their inertness and relatively large atomic weight. It is particularly preferable to use Ar, Kr, and Xe alone. When the Ar, Kr or Xe gas is used, sputtered atoms impinge repeatedly on the gas in the process of reaching the substrate, and arrive at the substrate while their kinetic energy is diminished. Such sputtered atoms with diminished kinetic energy cause less physical damage to an organic EL structure. It is also preferable to use a mixed gas containing at least one of Ar, Kr and Xe. When such a mixed gas is used, Ar, Kr, and Xe acts as a main sputtering gas provided that the sum of partial pressures of Ar, Kr and Xe is at least 50%. By using at least one of Ar, Kr and Xe in combination with any desired gas, it is thus possible to carry out reactive sputtering while the aforesaid advantages are maintained.

When any one of Ar, Kr and Xe is used as a main sputtering gas for the sputtering gas, it is preferable that the product of the sputtering gas pressure and the aforesaid substrate-to-target distance is in the following respective ranges:

25 to 55 Pa.cm, especially 30 to 50 Pa.cm for Ar
20 to 50 Pa.cm, especially 25 to 45 Pa.cm for Kr
20 to 50 Pa.cm, especially 20 to 40 Pa.cm for Xe Under these conditions, favorable results are obtainable irrespective of what gas is used for sputtering. However, it is most preferable to use Ar.

In the practice of the invention, it is possible to use an RF sputtering process using an RF power source or the like as the sputtering technique. In view of less damage to an organic EL device structure, however, it is preferable to use a DC sputtering process. Power for operating a DC sputtering system is in the range of preferably 0.1 to 4 W/cm$^2$, and especially 0.5 to 1 W/cm$^2$. The film forming rate is preferably in the range of 5 to 100 nm/min., and especially 10 to 50 nm/min.

The thin film cathode may have at least a certain thickness enough for the injection of electrons, e.g., of at least 50 nm, and preferably at least 100 nm. Thus, a film thickness of the order of 100 to 500 nm is usually preferable although there is no upper limit thereon.

The organic EL device of the invention may be provided with a protective layer comprising at least one of the oxide, nitride and carbide of the constituting material for the cathode while making use of such reactive sputtering as mentioned above. In this case, it is to be noted that the raw material for the protective layer has usually the same composition as that of the cathode material, although it may have somewhat different compositions or it may be free of one or more components of that material. Thus, it is possible to form the protective film continuously from the cathode by using the same material as the cathode material for the protective layer.

In the invention, the oxygen content of the oxide, the nitrogen content of the nitride, and the carbon content of the carbide may deviate more or less from the stoichiometric composition, or they may be 0.5 to 2 times as large as the stoichiometric composition.

Preferably, the same material as the cathode material, in a sintered form, is used for the target, and $O_2$, CO or the like is used as the reactive gas for oxide formation, $N_2$, $NH_3$, NO, $NO_2$, $N_2O$ or the like is used as the reactive gas for nitride formation, and $CH_4$, $C_2H_2$, $C_2H_4$ or the like is used as the reactive gas for carbide formation. These reactive gases may be used alone or in combination of two or more.

The protective layer may have at least a certain thickness enough to ensure prevention of penetration of moisture, oxygen or organic solvents, and so may have a thickness in the range of preferably at least 50 nm, more preferably at least 100 nm, and most preferably 100 to 1,000 nm.

Preferably but not exclusively, the total thickness of the cathode plus the protective layer is usually of the order of 100 to 1,000 nm.

By the provision of such a protective layer, it is possible to prevention oxidation or the like of the cathode and so to drive the organic EL device stably over an extended period of time.

The organic EL device produced according to the invention comprises a substrate, an anode provided on the substrate and a cathode provided thereon, and further includes at least one charge transporting layer and at least one light emitting layer between these electrodes as well as a protective layer in the form of the uppermost layer. In this regard, it is to be noted that the charge transporting layer may be dispensed with. In the invention, the cathode in a film form is made up of a metal, compound or alloy having a low work function by the sputtering technique as already noted, and the anode in a film form is constructed of tin-doped indium oxide (ITO), zinc-doped indium oxide (IZO), ZnO, $SnO_2$, $In_2O_3$ or the like by the sputtering technique.

A representative embodiment of the organic EL device produced according to the invention is shown in FIG. 1. An EL device as shown in FIG. 1 comprises a substrate 21, and an anode 22, a hole injecting and transporting layer 23, a light emitting and electron injecting/transporting layer 24, a cathode 25 and a protective layer 26 formed on the substrate in the described order.

The organic EL device of the invention is not limited to the structures illustrated, and so may have various structures. For instance, the light emitting layer may be provided in a single layer form and between this light emitting layer and the cathode there may be interleaved an electron injecting and transporting layer. If required, the hole injecting and transporting layer 23 may be mixed with the light emitting layer.

The cathode in a film form may be formed as mentioned above, the light emitting layer and other organic layers in film forms may be formed as by vacuum evaporation, and the anode in a film form may be formed as by evaporation or sputtering. If required, these films can be each patterned by mask evaporation or film formation followed by etching or the like, so that a desired light emitting pattern can be obtained. If the substrate is made up of thin film transistors (TFT), the respective films are then formed according to the TFT pattern for the immediate formation of a display or drive pattern.

If required, the aforesaid protective layer and/or an additional protective layer may be formed after electrode formation. This additional protective layer may be formed of a metal material such as Al, an inorganic material such as $SiO_x$ or an organic material such as Teflon. The protective layer may be either transparent or opaque, and has generally a thickness of the order of 50 to 1,200 nm. The protective layer may be formed either by the aforesaid reactive sputtering process or conventional processes such as general sputtering, evaporation or like other processes.

In the practice of the invention, it is preferred to form a sealing layer on the device in order to prevent oxidation of the organic and electrode layers. The sealing layer for preventing penetration of moisture may be formed by bonding sealing plates such as glass plates with adhesive resin layers of low hygroscopicity such as commercially available sheets of photo-curable adhesives, epoxy adhesives, silicone adhesives, and crosslinking ethylene-vinyl acetate copolymer adhesives. Instead of the glass plates, metal or plastic plates may also be used.

Next, the organic layers provided in the EL device of the invention are explained.

The light emitting layer has functions of injecting holes and electrons, transporting them, and recombining holes and electrons to create excitons. For the light emitting layer, it is preferable to use a relatively electronically neutral compound.

The charge transporting layer has functions of facilitating injection of holes from the anode, providing stable transportation of holes and blocking electrons, and is often called a hole injecting and transporting layer.

As occasion demands, for instance, when the ability of the compound used for the light emitting layer to inject and transport electrons is not particularly high, an electron injecting and transporting layer having functions of facilitating injection of electrons from the cathode, transporting electrons and blocking holes may be interleaved between the light emitting layer and the cathode, as already noted.

The hole injecting and transporting layer, and the electron injecting and transporting layer are effective for increasing the number of holes and electrons injected into the light emitting layer and confining holes and electrons therein for optimizing the recombination region to improve light emission efficiency.

It is to be noted that the hole injecting and transporting layer, and the electron injecting and transporting layer may be each provided in the form of a separate injecting layer and a separate transporting layer.

The thickness of the light emitting layer, the hole injecting and transporting layer, and the electron injecting and transporting layer is not restricted and varies with a particular formation technique although it is usually of the order of preferably 5 to 1,000 nm, and especially 10 to 200 nm.

The thickness of the hole injecting and transporting layer, and the electron injecting and transporting layer is equal to, or about 1/10 times to about 10 times as large as, that of the light emitting layer although it depends on the design of the recombination/light emitting region. When the electron or hole injecting and transporting layer is separated into an injecting layer and a transporting layer, it is preferable that the injecting layer is at least 1 nm thick and the transporting layer is at least 20 nm thick. The upper limit on thickness is usually about 100 nm for the injecting layer and about 1,000 nm for the transporting layer. The same film thickness applies when two injecting and transporting layers are provided.

It is also possible to gain thickness control while taking into consideration the carrier mobility, and carrier density (determined depending on ionization potential, and electron affinity) of the light emitting layer, electron injecting and transporting layer, or hole injecting and transporting layer to be combined, thereby designing freely the recombination region, and light emitting region. This in turn makes it possible to design the color of emitted light, to control the light emission luminance and light emission spectra due to the interference effect between both electrodes, and to control the spatial distribution of light emission.

In the organic EL device according to the invention, the light emitting layer contains a fluorescent material that is a compound capable of emitting light. The fluorescent material used herein, for instance, may be metal complex dyes such as those disclosed in JP-A 63-264692, e.g., tris(8-quinolinolato) aluminum (Alq$^3$). In addition to or instead of such a metal complex dye, use may be made of quinacridone, coumarin, rubrene, and styryl dyes as well as tetraphenyl-butadiene, anthracene, perylene, coronene, and 12-phthaloperinone derivatives. The light emitting layer may also serve as an electron injecting and transporting layer. In this case, it is preferable tc use tris(8-quinolinolato) aluminum, etc. These fluorescence materials may be provided by evaporation.

For the electron injecting and transporting layer which is provided if necessary, use may be made of organic metal complexes such as tris(8-quinolinolato)aluminum, oxadiazole derivatives, perylene derivatives, pyridine derivatives, pyrimidine derivatives, quinoline derivatives, quinoxaline derivative, diphenylquinone derivatives, and nitro-substituted fluorene derivatives. The electron injecting and transporting layer may also serve as a light emitting layer as previously mentioned. In this case, it is preferable to use tris(8-quinolinolato)aluminum, etc. Like the light emitting layer, the electron injecting and transporting layer may then be formed by evaporation or the like.

Where the electron injecting and transporting layer is a double-layered structure comprising an electron injecting layer and an electron transporting layer, compounds are selected in a preferably combination from the compounds commonly used for electron injecting and transporting layer. In this regard, it is preferred to laminate layer in such an order that a compound layer having a greater electron affinity is disposed contiguous to the cathode. This order of lamination also applies where a plurality of electron injecting and transporting layers are provided.

For the hole injecting and transporting layer, use may be made of various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (triaryldiamine or triphenyl-diamine (TPD)), aromatic tertiary amines, hydrazone derivatives, carbazole derivatives, triazole derivatives, imidazole derivatives, oxadiazole derivatives having an amino group, and polythiophenes. Where these compounds are used in combination of two or more, they may be stacked as separate layers, or otherwise mixed.

When the hole injecting and transporting layer is provided as a separate hole injecting layer and a separate hole transporting layer, two or more compounds are selected in a preferable combination from the compounds already mentioned for the hole injecting and transporting layer. In this regard, it is preferred to laminate layers in such an order that a compound layer having a lower ionization potential is disposed contiguous to the anode (ITO, etc.). It is also preferred to use a compound having good ability for forming thin film at the anode surface. This order of lamination holds for the provision of two or more hole injecting and transporting layers, and is effective as well for lowering driving voltage and preventing the occurrence of current leakage and the appearance and growth of dark spots. Since evaporation is utilized in the manufacture of devices, films as thin as about 1 to 10 nm can be formed in a uniform and pinhole-free state, which restrains any change in color tone of light emission and a drop of efficiency by re-absorption even if a compound having a low ionization potential and absorption in the visible range is used in the hole injecting layer.

For the provision of the hole injecting and transporting layer, the aforesaid compound may be provided by evaporation as in the case of the light emitting layer, etc.

Preferably, the material and thickness of the transparent electrode used as the anode in the invention are determined such that at least 80% of light emission is transmitted by the anode. More specifically, materials such as tin-doped indium oxide (ITO), zinc-doped indium oxide (IZO), $SnO_2$, and dopant-doped polypyrrole are preferably used for the anode. Anode thickness is preferably of the order of 10 to 500 nm. To improve the reliability of the device, the driving voltage must be low. From this perspective, ITOs of 10 to 30 Ω/□ (film thickness: 50 to 300 nm) are preferable. In actual applications, the thickness and optical constant of the anode may be determined such that the efficiency of taking out light emission and color purity are well satisfied by the interference effect due to reflection at the interface of the anode of ITO or the like.

Preferably, a large device such as a display device is interconnected with aluminum or other metal because the resistance of an ITO or other anode is increased, resulting in a voltage drop.

For the substrate material, transparent or translucent materials such as glass, quartz, and resins are used when the emitted light is taken out of the substrate side. The substrate may be provided with a color filter film, fluorescent material-containing color conversion film or dielectric reflecting film for controlling the color of light emission.

For the color filter film, a color filter used with liquid crystal display devices may be used. However, it is preferable to control the properties of the color filter in conformity to the light emitted from the organic EL device, thereby optimizing the efficiency of taking out light emission and color purity.

By using a color filter capable of cutting off extraneous light of such short wavelength as absorbed by the EL device material or the fluorescent conversion layer, it is possible to improve the light resistance of the device and the contrast of what is displayed on the device.

Instead of the color filter, an optical thin film such as a dielectric multilayer film may be used.

The fluorescent substance-containing color conversion film absorbs light emitted from an EL device and gives out light from the phosphors contained therein for the color conversion of light emission, and is composed of three components, a binder, a fluorescent material and a light absorbing material.

In the practice of the invention, it is basically preferable to use a fluorescent material having high fluorescent quantum efficiency, and especially a fluorescent material having strong absorption in an EL light emission wavelength region. Laser dyes are suitable for the practice of the invention. To this end, for instance, it is preferable to use rohodamine compounds, perylene compounds, cyanine compounds, phthalocyanine compounds (including subphthalocyanine compounds, etc.), naphthaloimide compounds, fused cyclic hydrocarbon compounds, fused heterocyclic compounds, styryl compounds, and coumarin compounds.

For the binder, it is basically preferable to make an appropriate selection from materials that do not extinguish fluorescence. It is particularly preferable to use a material that can be finely patterned by photolithography, printing or the like. It is also preferable to use a material that is not damaged during ITO film formation.

The light absorbing material is used when light is not fully absorbed by the fluorescent material, and so may be dispensed with, if not required. For the light absorbing material, it is preferable to make a selection from materials that do not extinguish fluorescence.

To form the hole injecting and transporting layer, the light emitting layer and the electron injecting and transporting layer, it is preferable to use a vacuum evaporation technique which allows to obtain a homogeneous thin film. According to the vacuum evaporation process, it is possible to obtain homogeneous thin films in an amorphous state or with a crystal grain diameter of at most 0.1 $\mu$m. The use of a thin film having a crystal grain diameter exceeding 0.1 $\mu$m results in non-uniform light emission. To avoid this, it is required to increase the driving voltage of the device; however, there is a striking drop of charge injection efficiency.

No particular limitation is imposed on vacuum evaporation conditions. However, an evaporation rate of the order of 0.01 to 1 nm/sec. is preferably applied at a degree of vacuum of up to $10^{-4}$ Pa. It is also preferable to form the layers continuously in vacuum. If the layers are continuously formed in vacuum, high properties are then obtained because the adsorption of impurities on the interface between the adjacent layers can be avoided. Furthermore, the driving voltage of the device can be lowered while the growth and occurrence of dark spots are inhibited.

When the vacuum evaporation process is used to form the layers, each containing a plurality of compounds, it is preferable to carry out co-evaporation while boats charged with the compounds are individually placed under temperature control.

The organic EL device of the invention is generally of the DC drive type while it may be of the AC or pulse drive type. The applied voltage is generally of the order of 2 to 20 volts.

EXAMPLE

The present invention are explained more specifically with reference to some examples and comparative examples.

Example 1

A glass substrate having a 200 nm-thick patterned ITO transparent electrode prepared by a sputtering process was ultrasonically washed with neutral detergent, acetone, and ethanol, and then pulled up from boiling ethanol, followed by drying. This transparent electrode was cleaned on its surface with UV/$O_3$, after which the substrate was fixed to a substrate holder in a vacuum evaporation system, which was evacuated to a vacuum of $1\times10^{-4}$ Pa or lower.

While the vacuum was maintained, N,N'-diphenyl-N,N'-m-tolyl-4,4'-diamino-1,1'-biphenyl (TPD) was evaporated at a deposition rate of 0.2 nm/sec. to a thickness of 55 nm to form a hole injecting and transporting layer.

With the vacuum still kept, Alq$^3$ or tris(8-quinolinolato) aluminum was evaporated at a deposition rate of 0.2 nm/sec. to a thickness of 50 nm to form a light emitting and electron injecting/transporting layer.

With the vacuum still kept, this EL device structure substrate was then transferred from the vacuum evaporation system to a sputtering system wherein DC sputtering was carried using an Na.Ni alloy (Na: 10 at %) as a target to form a cathode of 200 nm in thickness. Ar was used as the sputtering gas at a gas pressure of 3.5 Pa, and a target-to-substance distance (Ts) of 9.0 cm. The target size was 4 inches in diameter, and input power to the target was 100 W.

Finally, $SiO_2$ was sputtered to a thickness of 200 m to provide a protective layer, thereby assembling an organic EL light emitting device. This organic EL light emitting device comprised 8×2=16 picture elements or pixels, each of 2×2 mm, constructed by arranging two parallel striped cathodes perpendicularly with respect to 8 parallel striped anodes and disposing the pixels at an interval of 2 mm.

DC voltage was applied across this organic thin film light emitting device in an $N_2$ atmosphere for its continuous driving at a constant current density of 10 mA/cm$^2$. In the initial stage, the device was found to emit green light of 350 cd/m$^2$ (light emission maximum wavelength $\lambda$max=520 nm) at 9 V. The half life of luminance was 800 hours, during which a driving voltage increase of 2 V was observed.

The obtained organic EL devices were investigated regarding the initial light emission luminance of 160 pixels corresponding to 10 devices. Set out in Table 1 are the initial average light emission luminance, the half-life of light emission, and the occurrence of dark spots (after the lapse of 200 hours from the initiation of light emission). The occurrence of dark spots was estimated according to the following criteria.

◎: No dark spot was found at all.
○: At most two dark spots were found in a 10 mm$^2$ area on the light emitting surface.
X: Three or more dark spots were found in a 10 mm$^2$ area on the light emitting surface.

The results are also shown in Table 1.

Example 2

An organic EL device was prepared by forming a cathode of 200 nm in thickness as in Example 1. However, the binary sputtering targets used were an Na.Ni target and an Al.Ta target (Ta: 2 at %), and the input power was changed with time from DC 100 to 0 W for the Na.Ni target, and from DC 0 to 500 W for the Al.Ta target.

Observation of the composition of the formed cathode film showed that much Na is present on the interface at which the cathode film is contiguous to the organic layer, with the concentration of Na decreasing gradually in the thickness-wise direction. Here, let Co represent the concentration of Na across a sectional portion of the cathode extending from the interface between the organic layer and the side of the cathode not opposite thereto to the position corresponding to one-third of the cathode thickness, and Ci denote the concentration of Na across a sectional portion of the cathode extending from the interface between the organic layer and the cathode to the position corresponding to one-third of the cathode thickness. In this example, Co/Ci was 0.04 at %/0.5 at % with an average composition rate of 0.08. On the other hand, this organic EL device was estimated as in Example 1. As a result, it was found that the half-life of light emission increased to 1,000 hours, and that degradation of the cathode can be avoided due to the presence of the Na element having a concentration gradient. The results are shown in Table 1.

Example 3

An organic EL device was obtained as in Example 1, using Na.Ni, and Al.Ta targets as in Example 1. In this example, however, the Al.Ta target was used to laminate an Al.Ta thin film of 150 nm in thickness laminated on a 50 nm thick cathode formed using the Na.Ni target as in Example 1.

This organic EL device was estimated as in Example 1. As a result, it was found that the initial driving voltage drops to 8.5 V, and the half-life of light emission increases to 1,000 hours. The results are shown in Table 1.

Example 4

An organic EL device was formed as in Example 1 with the exception that the sputtering gas was changed to Kr, and sputtering was carried out at a gas pressure of 3.0 Pa and a target-to-substrate distance (Ts) of 9.0 cm. The obtained organic EL device was estimated as in Example 1. The results are shown in Table 1.

Example 5

An organic EL device was formed as in Example 1 with the exception that the sputtering gas was changed to Xe, and sputtering was carried out at a gas pressure of 2.5 Pa and a target-to-substrate distance (Ts) of 9.0 cm. The obtained organic EL device was estimated as in Example 1. The results are shown in Table 1.

Example 6

An organic EL device was formed as in Example 1 with the exception that the film forming gas pressure was changed to 2.5 Pa with a Ts of 9.0 cm. The obtained organic EL device was estimated as in Example 1. The results are shown in Table 1.

Example 7

An organic EL device was formed as in Example 1 with the exception that the film forming gas pressure was changed to 6.0 Pa with a Ts of 9.0 cm. The obtained organic EL device was estimated as in Example 1. The results are shown in Table 1.

Example 8

An organic EL device was formed as in Example 1 with the exception that the film forming gas pressure and Ts were changed to 8.0 Pa and 5.0 cm, respectively. The obtained organic EL device was estimated as in Example 1. The results are shown in Table 1.

Example 9

An organic EL device was formed as in Example 1 with the exception that the film forming gas pressure and Ts were changed to 12 Pa and 5.0 cm, respectively. The obtained organic EL device was estimated as in Example 1. The results are shown in Table 1.

Example 10

An organic EL device was formed as in Example 1 with the exception that the film forming gas pressure and Ts were changed to 8.0 Pa and 7.5 cm, respectively. The obtained organic EL device was estimated as in Example 1. The results are shown in Table 1.

Example 11

An organic EL device was formed as in Example 1 with the exception that the film forming gas pressure and Ts were changed to 2.5 Pa and 15 cm, respectively. The obtained organic EL device was estimated as in Example 1. The results are shown in Table 1.

Example 12

Organic EL devices were formed as in Example 1 with the exception that the Na.Ni target (Na: 10 at %) was replaced by the following targets.

Na.Ag (Na: 10 at %), Na.Au (Na: 10 at %),
Na.Co (Na: 10 at %), Na.Cr (Na: 10 at %),
Na.Cu (Na: 10 at %), Na.Fe (Na: 10 at %),
Na.Ir (Na: 10 at %), Na.La (Na: 10 at %),
Na.Mo (Na: 10 at %), Na.Nb (Na: 10 at %),
Na.Os (Na: 10 at %), Na.Pd (Na: 10 at %),
Na.Po (Na: 10 at %), Na.Rb (Na: 10 at %),
Na.Re (Na: 10 at %), Na.Rh (Na: 10 at %),
Na.Ru (Na: 10 at %), Na.Ta (Na: 10 at %),
Na.Th (Na: 10 at %), Na.W (Na: 10 at %),
Na.Zn (Na: 10 at %), Na.Pt (Na: 10 at %)
K.Ag (K: 10 at %), K.Au (K: 10 at %),

K.Co (K: 10 at %), K.Cr (K: 10 at %),
K.Cu (K: 10 at %), K.Fe (K: 10 at %),
K.Ir (K: 10 at %), K.La (K: 10 at %),
K.Mo (K: 10 at %), K.Nb (K: 10 at %),
K.Ni (K: 10 at %), K.Os (K: 10 at %),
K.Pd (K: 10 at %), K.Po (K: 10 at %),
K.Rb (K: 10 at %), K.Re (K: 10 at %),
K.Rh (K: 10 at %), K.Ru (K: 10 at %),
K.Ta (K: 10 at %), K.Th (K: 10 at %),
K.W (K: 10 at %), K.Zn (K: 10 at %),
K.Pt (K: 10 at %)

The obtained organic EL devices were estimated as in Example 1. As a result, similar results as in Example 1 were obtained for each organic EL device.

Comparative Example 1

An organic EL device was obtained as in Example 1 with the exception that a pure Ni target was used in place of the Na.Ni target.

DC voltage was applied across the obtained device in an $N_2$ atmosphere for its continuous driving at a constant current density of 10 mA/cm$^2$. Initially, the device was found to emit green light of 80 cd/m$^2$ (light emission maximum wavelength $\lambda$max=520 nm) at 10 V, which was much lower than the initial light emission luminance obtained in Example 1. The half-life of luminance was 400 hours, during which a driving voltage increase of 4 V was observed.

This organic EL device was estimated as in Example 1. The results are shown in Table 1.

Comparative Example 2

An organic EL device was formed as in Example 1 with the exception that the gas pressure was changed to 1.0 Pa. The obtained organic EL device was estimated as in Example 1. As a result, the initial light emission luminance was too low for its precise measurement. The occurrence of dark spots could not be estimated because of too low luminance. The results are shown in Table 1.

Comparative Example 3

An organic EL device was formed as in Example 1 with the exception that the gas pressure was changed to 12 Pa. The obtained organic EL device was estimated as in Example 1. As a result, the initial light emission luminance was too low for its precise measurement. The occurrence of dark spots could not be estimated because of too low luminance. The results are shown in Table 1.

Comparative Example 4

An organic EL device was formed as in Example 1 with the exception that the gas pressure and Ts were changed to 1.0 Pa and 5.0 cm, respectively. The obtained organic EL device was estimated as in Example 1. As a result, the initial light emission luminance was too low for its precise measurement. The occurrence of dark spots could not be estimated because of too low luminance. The results are shown in Table 1.

TABLE 1

| | Sputtering Gas | Gas Pressure (Pa) | Ts (cm) | Gas Pressure × Ts | Average Light Emission Luminance (cd/m$^2$) | Driving Voltage (V) | Half-Life of Luminance (h) | Dark Spots |
|---|---|---|---|---|---|---|---|---|
| Example 1 | Ar | 3.5 | 9.0 | 31.5 | 350 | 9.0 | 800 | ◉ |
| Example 2 | Ar | 3.5 | 9.0 | 31.5 | 350 | 9.0 | 1000 | ◉ |
| Example 3 | Ar | 3.5 | 9.0 | 31.5 | 350 | 8.5 | 1000 | ◉ |
| Example 4 | Ar | 3.0 | 9.0 | 27.0 | 345 | 9.0 | 800 | ◉ |
| Example 5 | Xe | 2.5 | 9.0 | 22.5 | 340 | 9.0 | 750 | ◉ |
| Example 6 | Ar | 2.5 | 9.0 | 22.5 | 350 | 9.0 | 800 | ○ |
| Example 7 | Ar | 6.0 | 9.0 | 54.0 | 340 | 9.0 | 800 | ○ |
| Example 8 | Ar | 8.0 | 5.0 | 40.0 | 345 | 9.0 | 750 | ◉ |
| Example 9 | Ar | 12 | 5.0 | 60 | 340 | 9.0 | 750 | ○ |
| Example 10 | Ar | 8.0 | 7.5 | 60 | 340 | 9.0 | 700 | ○ |
| Example 11 | Ar | 2.5 | 15 | 37.5 | 345 | 9.0 | 750 | ◉ |
| Comp. Ex. 1 | Ar | 4.5 | 9.0 | 40.5 | 80 | 10.0 | 400 | x |
| Comp. Ex. 2 | Ar | 1.0 | 9.0 | 9.0 | <40 | 10.0 | 300 | x |
| Comp. Ex. 3 | Ar | 12 | 9.0 | 108 | <40 | 11.0 | 300 | x |
| Comp. Ex. 4 | Ar | 1.0 | 5.0 | 5.0 | <40 | 11.0 | 290 | x |

According to the present invention, it is possible to achieve an organic EL device comprising a cathode which is improved in terms of its interfacial adhesion to an organic layer and electron injection efficiency, and so makes a contribution to improvements in light emission properties and causes less damage to the organic layer, and which reduces the occurrence of dark spots and suffers from little or no degradation of performance.

Japanese Patent Application No. 194810/1997 is herein incorporated by reference.

While the invention has been described with reference to preferred embodiments, it will be obvious to those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed as the best ode contemplated for carrying out the invention, but that the invention will include all embodiments falling within the scope of the appended claims.

What we claim is:

1. An organic electroluminescent device comprising and anode and an organic layer and cathode, said cathode prepared by a sputtering technique, and formed of an alloy containing 1 to 60 at % of sodium, potassium or sodium and potassium.

2. The organic electroluminescent device according to claim 1, wherein said cathode has a concentration gradient in a thickness-wise direction thereof, said concentration gradient having a higher concentration of sodium, potassium or sodium and potassium on an interface side between said cathode and said organic layer.

3. The organic electroluminescent device according to claim 1, wherein said cathode further comprises an aluminum alloy layer composed mainly of aluminum on a side opposite to said organic layer.

4. The organic electroluminescent device according to claim 1, wherein said alloy is an alloy of sodium, potassium or sodium and potassium with at least one element selected from a group consisting of a transition metal element, aluminum, gallium, indium, and titanium.

5. The organic electroluminescent device according to claim 4, wherein said transition metal element is chromium, iron, cobalt, nickel, copper, zinc, rubidium, niobium, molybdenum, ruthenium, rhodium, palladium, silver, lanthanum, tantalum, tungsten, rhenium, osmium, iridium, platinum, gold, polonium, and thorium.

6. The organic electroluminescent device according to claim 3, wherein said aluminum alloy layer having an aluminum content of at least 80 at %.

7. The organic electroluminescent device according to claim 2, wherein said cathode has a concentration gradient in the Co/Ci range of at most 0.5.

8. An organic electroluminescent device comprising and anode and an organic layer and cathode, said cathode prepared by a sputtering technique, and formed of an alloy containing 1 to 60 at % of sodium, potassium or sodium and potassium with the balance being at least one element selected from the group consisting of chromium, iron, cobalt, nickel, copper, zinc, rubidium, niobium, molybdenum, ruthenium, rhodium, palladium, silver, lanthanum, tantalum, tungsten, rhenium, osmium, iridium, platinum, gold, polonium, thorium, aluminum, gallium, indium and titanium.

* * * * *